United States Patent
Kulkarni et al.

(10) Patent No.: US 8,810,233 B2
(45) Date of Patent: Aug. 19, 2014

(54) PHASE IDENTIFICATION SYSTEM AND METHOD

(75) Inventors: Prasad Kulkarni, Bangalore (IN); Amol Rajaram Kolwalkar, Bangalore (IN)

(73) Assignee: General Electric Company, Niskayuna, NY (US)

(*) Notice: Subject to any disclaimer, the term of this patent is extended or adjusted under 35 U.S.C. 154(b) by 373 days.

(21) Appl. No.: 13/217,370

(22) Filed: Aug. 25, 2011

(65) Prior Publication Data

US 2013/0049732 A1    Feb. 28, 2013

(51) Int. Cl.
*G01R 19/00* (2006.01)

(52) U.S. Cl.
USPC .......................................................... 324/66

(58) Field of Classification Search
USPC .......................................................... 324/66
See application file for complete search history.

(56) References Cited

U.S. PATENT DOCUMENTS

| | | | |
|---|---|---|---|
| 3,027,513 A | 3/1962 | Mulavey et al. |
| 4,626,622 A | 12/1986 | Bouvette |
| 4,852,174 A | 7/1989 | Bouchard |
| 5,351,181 A | 9/1994 | Brennan et al. |
| 5,510,700 A | 4/1996 | Pomatto |
| 5,521,491 A | 5/1996 | Najam |
| 5,617,329 A | 4/1997 | Allison et al. |
| 5,883,796 A | 3/1999 | Cheng et al. |
| 6,130,531 A | 10/2000 | Hao |
| 6,326,796 B1 | 12/2001 | Koda et al. |
| 6,642,700 B2 | 11/2003 | Slade et al. |
| 6,657,322 B2 | 12/2003 | Skibinski et al. |
| 6,667,610 B2 | 12/2003 | Piesinger |
| 7,031,859 B2 | 4/2006 | Piesinger |

(Continued)

FOREIGN PATENT DOCUMENTS

| | | |
|---|---|---|
| EP | 1233526 A1 | 8/2002 |
| EP | 2330430 A1 | 6/2011 |
| WO | 9311605 A1 | 6/1993 |
| WO | 2006100695 A1 | 9/2006 |

OTHER PUBLICATIONS

Khadkikar, et al., Implementation of single-phase synchronous d-q reference frame controller for shunt active filter under distorted voltage condition, 2010 Joint International Conference on Power Electronics, Drives and Energy Systems, pp. 1-6, Dec. 2010.*
H. Akagi, "Trends in Active Power Line Conditioners," IEEE, ISBN: 0-7803-0582-5, vol. 1, Aug. 6, 2002, pp. 19-24.
Saitou et al., "A Control Strategy of Single-Phase Active Filter Using a Novel d-q Transformation", Conference Record of the 2003 IEEE Industry Applications Conference. 38th. IAS Annual Meeting, New York, vol. No. 2, pp. 1222-1227, Oct. 12, 2003.

(Continued)

*Primary Examiner* — Melissa Koval
*Assistant Examiner* — Daniel Miller
(74) *Attorney, Agent, or Firm* — Jason K. Klindtworth (57) ABSTRACT

A phase identification system includes a power distribution station and a phase detection device. The power distribution station includes a phase distortion device for generating voltage distortions of a known harmonic frequency in at least one of three phase voltage signals of the power distribution station. The phase detection is configured to receive at least one of distorted three phase voltage signals and to identify a phase of the received voltage signal. The phase detection device includes a delay circuit to generate a phase shifted voltage signal of the received voltage signal and a transformation module to transform the received voltage signal and the phase shifted voltage signal into d-q domain voltage signals of a known harmonic frequency reference frame. A phase determination module in the phase detection device determine the phase of the received voltage signal by comparing an amplitude of a harmonic of the known harmonic frequency in the received voltage signal with a threshold value.

22 Claims, 5 Drawing Sheets

(56) References Cited

U.S. PATENT DOCUMENTS

| | | |
|---|---|---|
| 7,372,246 B2 | 5/2008 | Marsden et al. |
| 2004/0229584 A1 | 11/2004 | Fischer et al. |
| 2008/0011687 A1 | 1/2008 | Campo et al. |
| 2011/0130991 A1 | 6/2011 | Koste et al. |

OTHER PUBLICATIONS

European Search Report and Opinion issued in connection with corresponding EP Application No. 12180555.0 on May 23, 2014.

* cited by examiner

PHASE IDENTIFICATION SYSTEM AND METHOD

BACKGROUND

The present invention relates generally to the field of three-phase power distribution networks. More specifically, the invention relates to a system and method of identifying the phase of a power line in a three-phase power distribution network.

Modern power distribution systems often deliver three phase voltage to users. That is, a power line may, for example, include a plurality of conductors each designated as a specific phase of voltage. Moreover, the power distribution system may be set up to operate such that the loads of the power line are balanced (e.g., the amount of power drawn from each phase output of, for example, a three-phase transformer, is equal). However, over time, users may be added and removed from the network, which may result in an imbalance in the phase currents and voltage flow. That is, too many users may be connected to one phase of voltage while too few are connected to a second and/or third phase. This may result in a non-optimal utilization of the existing infrastructure. One manner of overcoming this load imbalance may be to institute a rebalancing of the loads, for example, by moving customers from a more highly used phase of voltage to a lesser used phase of voltage.

However, challenges exist in moving customers from one phase of voltage to another. For instance, as customers are added to and subtracted from a power distribution network, the phase of voltage that a given customer is connected to may be difficult to ascertain without costly physical tracking (typically by a worker in the field) of a given power line to the network. That is, while a load imbalance may be detected remotely, the phase to which the individual users are connected to may not be readily apparent without physically tracking the power lines from a substation to the respective user locations. Accordingly, it would be advantageous to ascertain the phase of voltage to which a user is connected to without sending a person to one or more user sites to physically determine the voltage phase being received at the various sites. Further, identifying correct phase of the loads enables differentiation between single phase and three phase faults and in turn enables the accuracy of outage management systems that rely on the phase information.

One of the methods of identifying phase is by using modems and telephone lines to establish a communication link. A signal associated with the phase at a point in the network where the phase of the line is known (the reference line) is transmitted over the communication link to a point in the network where the phase of the line is not known (the line under test). In another method, radio signals are used instead of modems and telephone lines for communication. However, both these techniques require calibration procedures and special training to be used effectively. An additional method of measuring the phase is by means of precise time stamped measurements (usually using GPS) at the substation where the phase is known and at the remote location where phase is unknown. By estimating the phase difference between the two signals, the phase at the remote location can be determined. However, this method needs two-way communications or information at two different locations to identify the phase.

Accordingly, there is a need to provide an improved apparatus and method for the identification of line phase of a power line in a power distribution network.

BRIEF DESCRIPTION

In accordance with an embodiment of the present invention, a phase identification system is provided. The system includes a power distribution station including a phase distortion device to generate voltage distortions of a known harmonic frequency in at least one of three phase voltage signals of the power distribution station. The system further includes a phase detection device configured to receive one of distorted three phase voltage signals and to identify a phase of the received voltage signals. The phase distortion device includes a delay circuit for generating a phase shifted voltage signal of the received voltage signal, a transformation module for transforming the received voltage signal and the phase shifted voltage signal into d-q domain voltage signals of a known harmonic frequency reference frame. The phase detection device also includes a phase determination module for determining the phase of the received voltage signal by comparing an amplitude of a harmonic of the known harmonic frequency in the received voltage signal with a threshold value.

In accordance with another embodiment of the present invention, a method of identifying phase including distorting each of a three phase voltages of a power distribution system with a known harmonic frequency is provided. The method also includes receiving at least one of distorted three phase voltage signals from a power distribution system and generating a phase shifted voltage signal of the received voltage signal by time delaying the received voltage signal. The method further includes transforming the received voltage signal and the phase shifted voltage signal into d-q domain voltage signals of a known harmonic frequency reference frame and determining the phase of the received voltage signal by comparing an amplitude of a harmonic of the known harmonic frequency in the received voltage signal with a threshold value.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

As used herein, the term "module" refers to software, hardware, or firmware, or any combination of these, or any system, process, or functionality that performs or facilitates the processes described herein.

Figure 1:
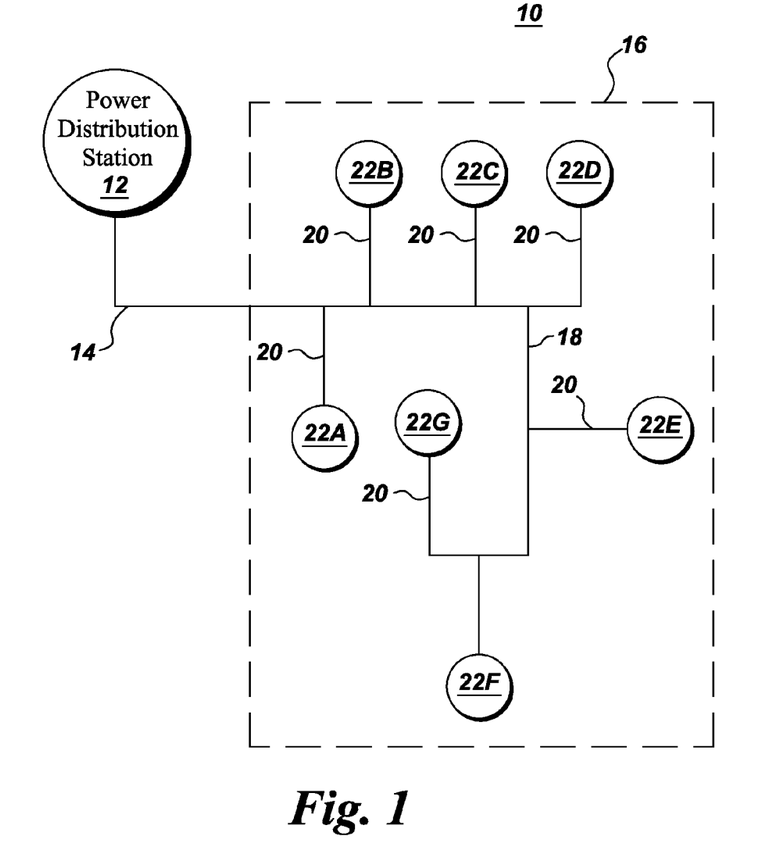
FIG. 1 is a block diagram of a power grid, in accordance with an embodiment of the present invention.

FIG. 1 illustrates a block diagram of power grid 10. The power grid 10 transmits power from a power distribution station 12 to power distribution network 16 via, for example, one or more power lines 14. The power distribution station 12 may, for example, include a power plant including one or more power generators that may generate voltage for transmission on the power grid 10. Additionally, or alternatively, the power distribution station may include one or more power substations that may include one or more transformers that operate to transform voltage from one voltage to another (e.g., step-down received voltages from, for example, 100,000 volts to less than 10,000 volts) and/or one or more distribution busses for further routing the power.

In one embodiment, the power lines 14 may include a plurality of transmission paths for transmission of power from the power distribution station 12 to the power distribution network 16. For example, the power lines 14 may transmit voltage in three phases, e.g. phases A, B and C. Additionally, the power lines 14 may include a neutral line in addition to the paths for transmission of the three phases of voltage.

The power distribution network 16 may distribute the three phase voltage to a plurality of users. The distribution network 16 may include, for example, one or more taps 18. The one or more taps may operate to split off one or more of the power line 14 to, for example, a side street on which one or more users reside. The tap 18 may thus operate to split one or more of the voltage phases A, B and C ("A-C") to the users on this side street. The power distribution network 16 may also include user lines 20. The user lines 20 may operate as direct connections to the power lines 14. In one embodiment, each user line 20 may include a transformer for stepping down the voltage from one level to another. The two voltage levels may be 7200 volts and 240 volts, for example. Additionally, it should be noted that each of the user lines 20 may be connected to a single phase of voltage. That is, each user line 20 may be connected to phase A, phase B, or phase C voltage. The 240 volt phase A, phase B, or phase C voltage may be transmitted to a user with meters 22A-22G connected in the circuit.

Each of the meters 22A, 22B, 22C, 22D, 22E, 22F and 22G ("22A-22G") may operate to monitor the amount of energy being transmitted to and consumed by a particular user. In one embodiment, one or more of the meters 22A-22G may be a portion of an advanced metering infrastructure (AMI) such that the meters 22A-22G may measure and record usage data in specified amounts over predetermined time periods (such as by the minute or by the hour), as well as transmit the measured and recorded information to the power distribution station 12. In another embodiment, the meters 22A-22G may allow for transmission of additional information, such as power outages, voltage phase information, or other infrastructure information, to be sent to the power distribution station 12 for assessment.

Figure 2:
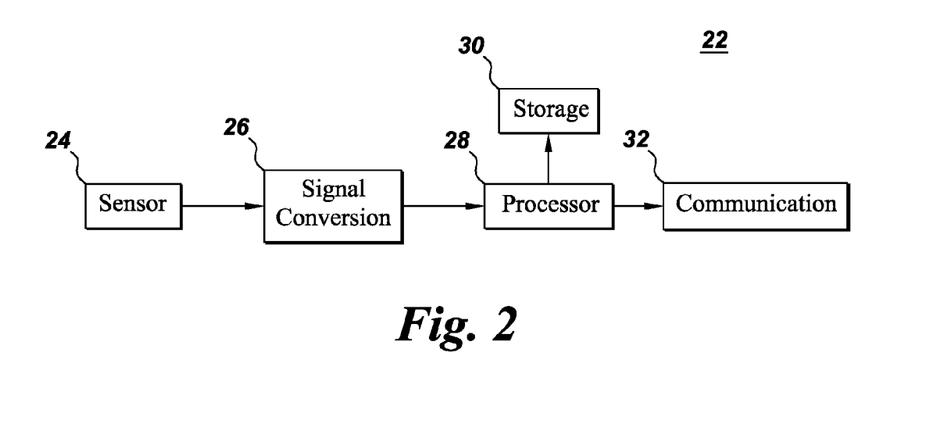
FIG. 2 is a block diagram of a meter of the power grid of FIG. 1, in accordance with an embodiment of the present invention.

FIG. 2 illustrates a block diagram of a meter 22, which may be representative of any of the meters 22A-22G. As illustrated, the meter 22 may include a sensor 24, signal conversion circuitry 26, one or more processors 28, storage 30, and communication circuitry 32. In conjunction, the sensor 24, the signal conversion circuitry 26, one or more processors 28, the storage 30, and the communication circuitry 32 allow the meter 22 to determine and transmit a signal indicative of the phase of voltage being received at the meter 22. In this manner, the meter 22 may operate as a phase detection device.

Meter 22, in one embodiment, is physically attached at the location where the power is being used. Additionally or alternatively, the phase detection device may comprise a handheld metering device, and the determination and/or transmission of a signal indicative of the phase of voltage being received may be performed by the hand-held metering device. In one embodiment, the sensor 24 may include electrical components for receiving and measuring the current and voltage from the user line 20. As noted above, this voltage may be in one of three phases, phase A, phase B, or phase C, each 120 degrees out of phase with one another. The sensor 24 may transmit the detected voltage and/or current as a signal to the signal conversion circuitry 26. Additionally, the sensor 24 may detect distortions in voltage signals at the meter 22. As will be discussed in greater detail below, the distortions in voltage signals may be used to obtain a determination of the received phase of voltage at the meter 22.

The signal conversion circuitry 26 may include, for example, voltage conversion circuitry to convert the voltage of the signal received from the sensor 24 from 240 volts to approximately 5 volts, for example. Additionally, the voltage conversion circuitry may, for example, include at least one analog to digital converter for transforming signals received from the sensor 24 (such as voltage signals or injected signals) from analog form into digital signals for processing by one or more processors 28.

The one or more processors 28 provide at least part of the processing capability for the meter 22. The one or more processors 28 may include one or more microprocessors, such as one or more "general-purpose" microprocessors, one or more special-purpose microprocessors and/or ASICS, or some combination of such processing components. Additionally, programs or instructions executed by the one or more processors 28 may be stored in any suitable media that includes one or more tangible, computer-readable media at least collectively storing the executed instructions or routines, such as, but not limited to, the storage device described below. As such, the meter 22 may include programs encoded on a computer program product (such as storage 30), which may include instructions that may be executed by the one or more processors 28 to enable the meter 22 to provide various functionalities, including determining the phase of voltage received at the meter 22 based on, for example, distortions in the voltage signal.

The instructions and/or data to be processed by the one or more processors 28 may be stored in a computer-readable medium, such as storage 30. The storage 30 may include a volatile memory, such as random access memory (RAM), and/or a non-volatile memory, such as read-only memory (ROM). In one embodiment, the storage 30 may store firmware for the meter 22 (such as various programs, applications, or routines that may be executed on the meter 22). In addition, the storage 30 may be used for buffering or caching during operation of the meter 22. The storage 30 may include, for example, flash memory, a hard drive, or any other optical, magnetic, and/or solid-state storage media. The storage 30 may also be used to store information for eventual transmission via communication circuitry 32. The information stored may include the phase information that can be used later for example during meter reading by the utility.

Communication circuitry 32 may be utilized to transmit information from the meter 22 to, for example, the power distribution station 12 (FIG. 1). The information may, for example, include one or more signals indicating the phase of voltage being received at the meter 22, the voltage usage at the meter 22, and/or other information relating to the operation of the meter 22. Accordingly, the communication circuitry 32 may include, for example, a transceiver for transmitting and receiving information with the power distribution station 12 and/or other meters (e.g., 22A-22G). The communication circuitry 32 may, instead, include a transmitter, which may allow for transmission of information to, for example, the power distribution station 12 and/or other meters, but will not receive information. The communication circuitry 32 may further include wireless transmission and/or transceiver elements for wireless transmission and/or reception of information. Additionally and/or alternatively, the communication circuitry 32 may be physically coupled to the power distribution station 12 through a wired communication mode, power line carrier communication (PLC) circuitry, for example. Regardless of the transmission medium, through the use of communication circuitry 32, the meter 22 may be able to transmit collected information including the phase of voltage being received at the meter 22.

Figure 3:
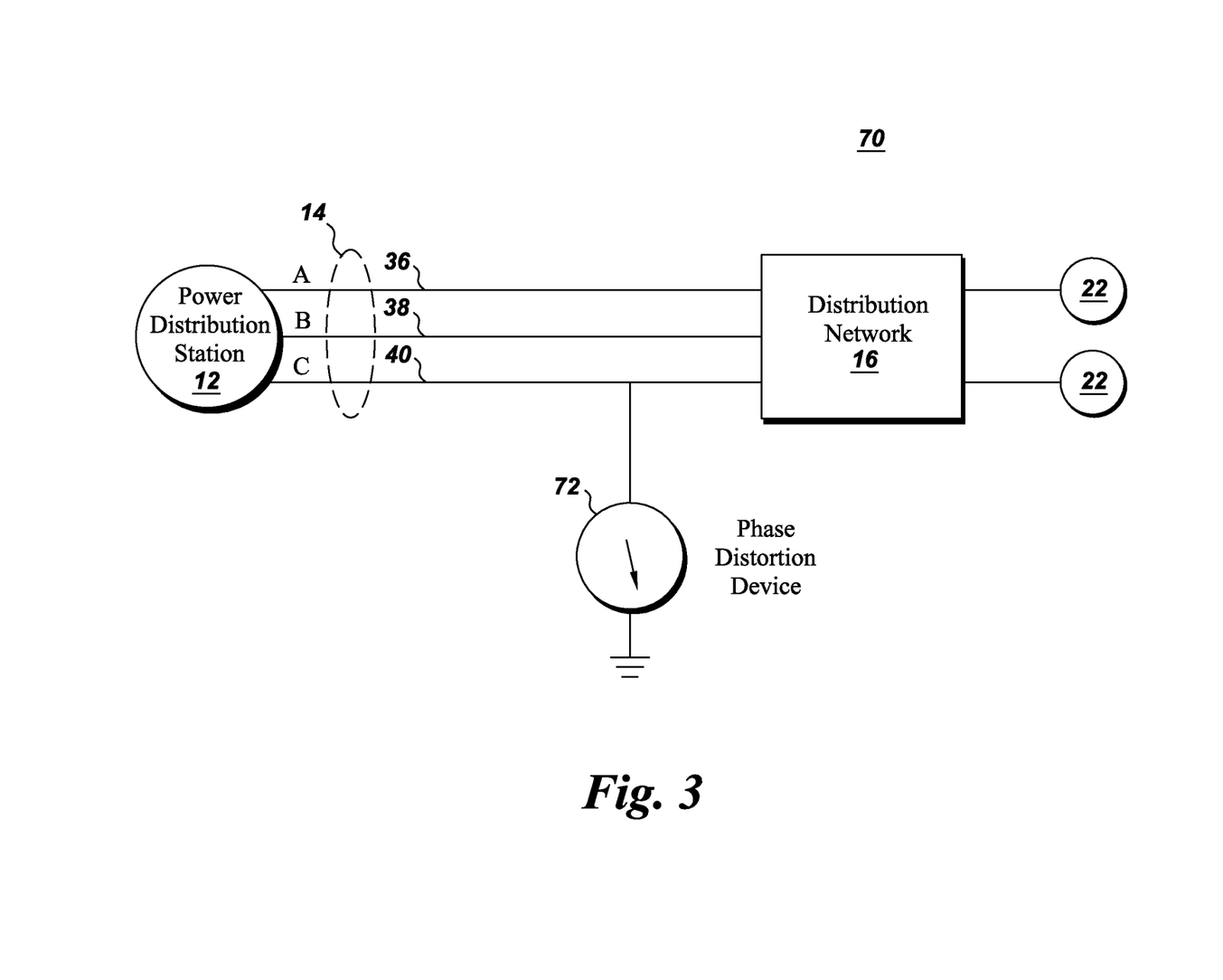
FIG. 3 is a block diagram of a power distribution station of the power grid with a phase distortion device, in accordance with an embodiment of the present invention.

FIG. 3 is a block diagram 70 of a power distribution station 12 with a phase distortion device 72 that may be utilized in conjunction with the meters 22 to determine the phase of voltage being supplied to a given user. The power distribution station 12 may operate to transmit three phase voltage across power lines 14, such that phase A voltage may be transmitted across line 36, phase B voltage may be transmitted across line 38, and phase C voltage may be transmitted across line 40. It should be noted that the phase line labeling of phase A, phase B, and phase C for lines 36, 38, and 40 is only for purposes of example. In one embodiment, the phase distortion device 72 includes a shunt current circuitry which is configured to draw a harmonic current from any one of the phases and to distort the phase voltage signals at the load point on a distribution network 16. When the harmonic current is drawn from a phase, it results in harmonic voltage drop across the transmission line resulting in distortions on power line voltage signal of that phase. It should be noted that even though only one phase distortion device 72 is shown in FIG. 3, in some embodiments each of the phases will have a separate phase distortion device 72 (i.e., 3 phase distortion devices for 3 phases).

The power line voltage signals may be distorted either on command or on a schedule. For example, a utility may initiate a distortion in response to the amount of unbalance seen in the network. Additionally or alternatively, the distortion may be set to occur at a constant frequency of occurrence such as, for example at a particular time every day. The distorted phase voltage on a particular phase or a power line is then transmitted over that particular power line, for example, 36, 38, or 40 and reach meter 22 in power distribution network 16, and meter 22 identifies the distortion and hence the phase depending on a characteristic of the distortion received. In one embodiment, the meter 22 may also transmit the identified phase information to the power distribution station 12 (FIG. 1).

Figure 4:
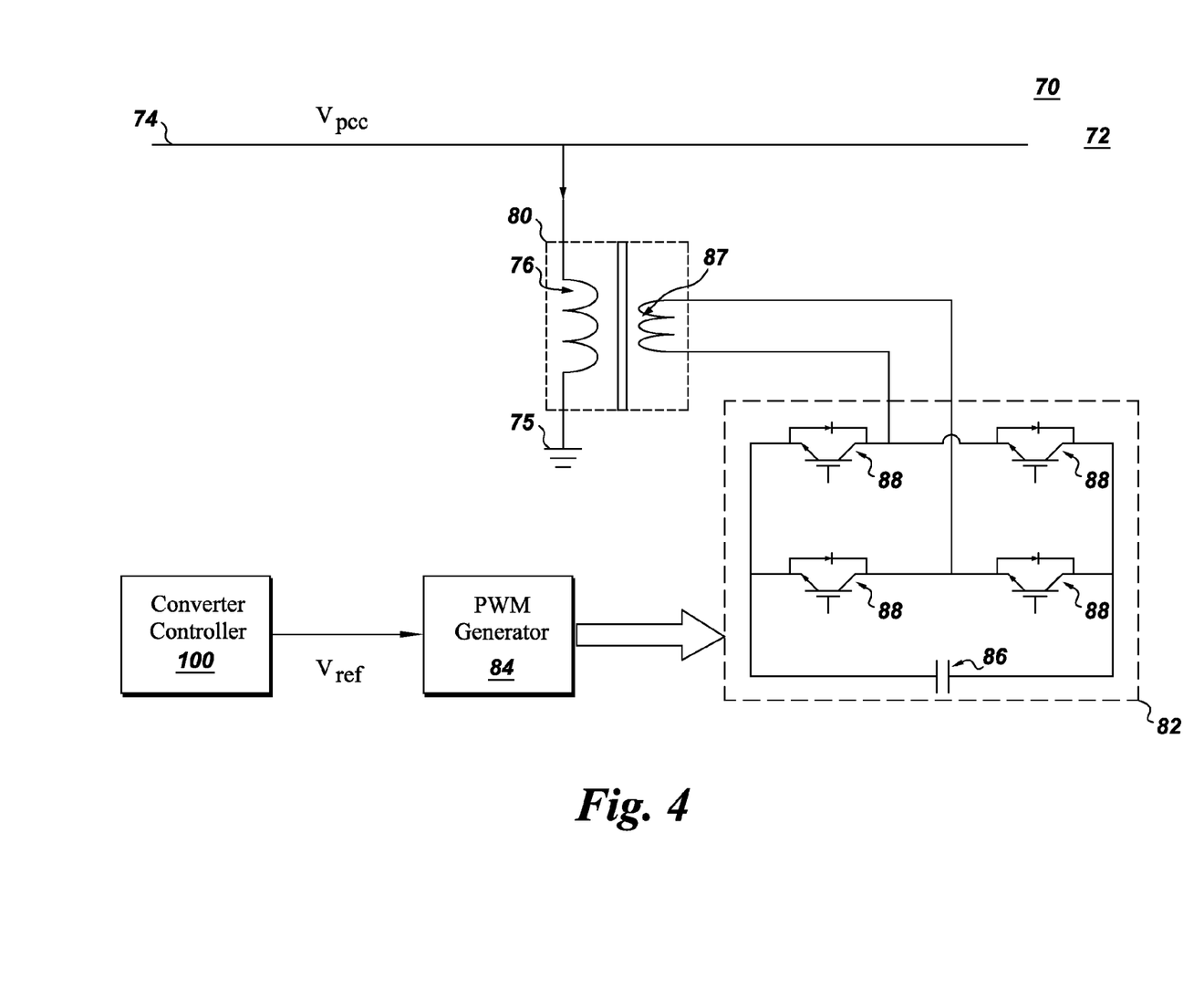
FIG. 4 is a schematic of the phase distortion device of FIG. 3, in accordance with an embodiment of the present invention.

FIG. 4 is a schematic of the phase distortion device 72 of FIG. 3 in accordance with an embodiment of the present invention. The phase distortion device is configured to draw harmonic currents from a power line 74 and includes a coupling transformer 80, a single phase DC to AC converter 82 and a pulse width modulation (PWM) generator 84 for providing switching signals to single phase DC to AC converter 82. The coupling transformer 80 matches the voltage of the power line with the output of the single phase DC to AC converter 82 and also provides isolation between the power line and the single phase DC to AC converter 82 The single phase DC to AC converter 82 includes a DC link 86 and semiconductor switches 88. A primary winding 76 of coupling transformer 80 is shunt connected to the power line 74 (i.e., primary winding 76 is connected between power line 74 and a ground connection 75). A secondary winding 87 of coupling transformer 80 is connected across the output of single phase DC to AC converter 82. PWM generator 84 provides switching signals to single phase DC to AC converter 82 based on a reference voltage signal Vref generated by a converter controller 100. The reference voltage is determined based on the amount of active power the single phase DC to AC converter 82 requires and also the harmonic current requirement for voltage distortion. The active power required by the single phase DC to AC converter 82 is utilized for supporting losses of the converter and also for maintaining voltage of the DC link 86.

In one embodiment, three different harmonic frequencies may be drawn from three different phases and the resulting voltage distortion may be analyzed by the meter 22 at a load point (not shown). The analysis of the voltage distortion can then determine the phase of the power line to which the load is connected. There may be multiple methods to analyze the voltage distortion, one of which will be described in the succeeding paragraphs.

Figure 5:
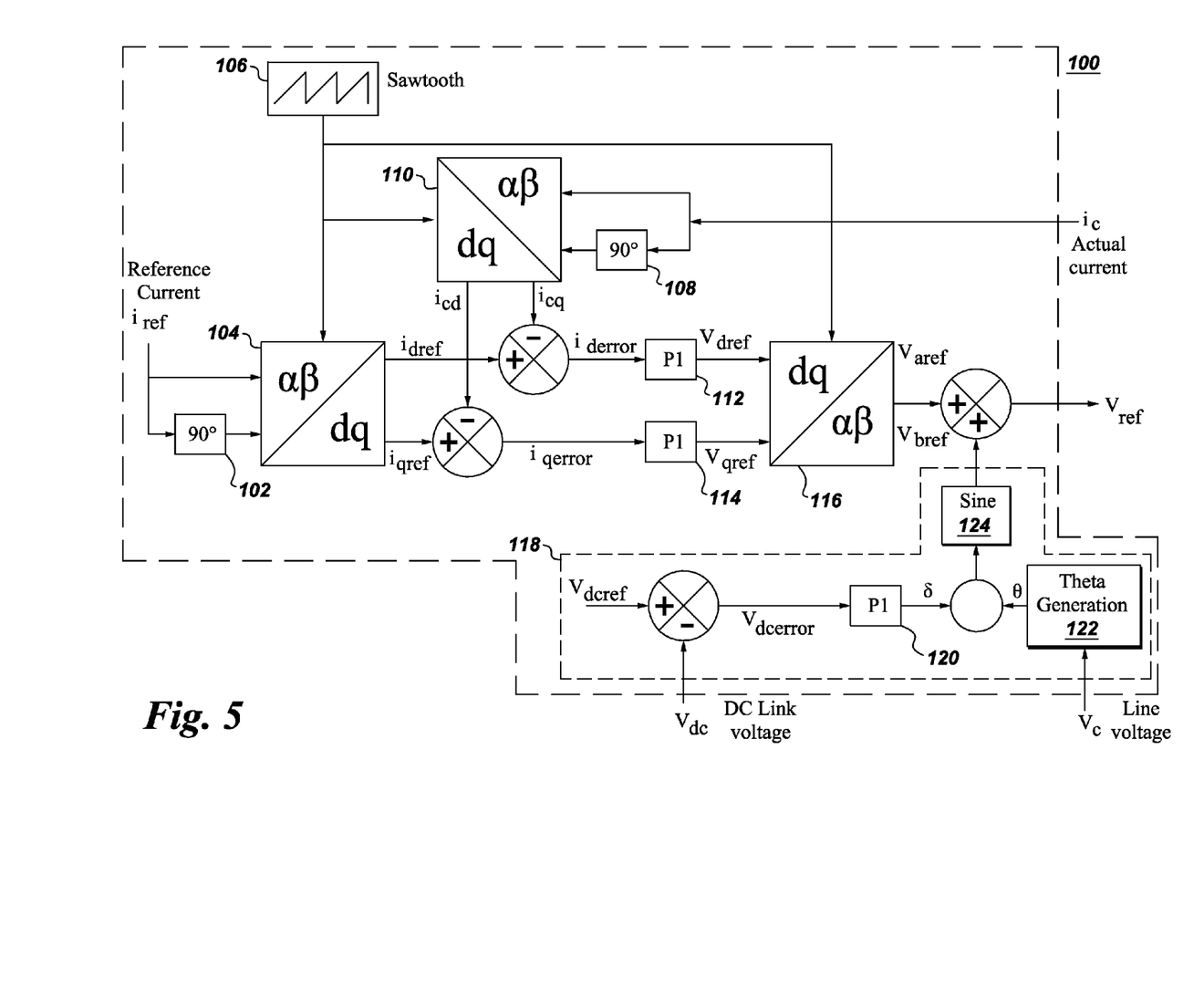
FIG. 5 is a block diagram of a converter controller in accordance with an embodiment of the present invention.

FIG. 5 is a block diagram of a converter controller 100 in accordance with an embodiment of the present invention. Converter controller 100 generates reference voltage for DC to AC converter 82 of FIG. 4 based on a required harmonic current to be drawn from the power line. Converter controller 100 receives a current $i_c$, a line voltage $v_c$ and DC link voltage $V_{dc}$ as inputs and provides reference voltage signal $V_{ref}$ as output. Current $i_c$ is an actual current drawn by DC to AC converter 82 from the power line 74 whereas voltage $v_c$ is a voltage of the power line 74. Reference signals $i_{ref}$ and $V_{dcref}$ are determined by a system operator. The reference current $i_{ref}$ is a harmonic current (e.g., $8^{th}$, $9^{th}$, $10^{th}$, etc.) that needs to be drawn from the power line whereas the reference voltage $V_{dcref}$ is the DC link voltage that needs to be maintained for DC to AC converter 82. The reference current $i_{ref}$ is phase shifted by 90 degrees by a first phase shifter module 102 and then the reference current and the phase shifted current are converted into d-q components $i_{dref}$ and $i_{qref}$ by a first α-β to d-q domain transformation module 104. As will be appreciated by those skilled in the art, the α-β to d-q domain transformation module 104 may include a transformation matrix that transforms the voltage signals from one reference frame to another reference frame based on an input phase signal. In one embodiment, the transformation matrix may be given as:

$$\begin{bmatrix} \cos \omega t & \sin \omega t \\ \sin \omega t & -\cos \omega t \end{bmatrix} \quad (1)$$

where ω is a frequency in radians/second and t is time in seconds.

The first α-β to d-q domain transformation module 104 receives a saw tooth wave signal as the phase signal from the saw tooth wave generator module 106 to convert the reference currents into d-q reference currents $i_{dref}$ and $i_{qref}$. The saw tooth wave signal is synchronized with the reference current signal and its frequency is the same as that of the reference current signal i.e., the harmonic frequency.

The actual current $i_c$ drawn by DC to AC converter 82 is also converted into measured d-q domain currents $i_{cd}$ and $i_{cq}$ by a second phase shifter module 108 and a second α-β to d-q domain transformation means or matrix 110. Error signals $i_{derror}$ and $i_{qerror}$ representing a difference between d-q domain reference currents $i_{dref}$ and $i_{qref}$ and measured d-q domain currents and $i_{cd}$ and $i_{cq}$ are then fed to two proportional-integral (PI) controllers 112, 114 to generate d-q domain reference voltage signals $v_{dref}$ and $v_{qref}$. PI controllers 112, 114 basically generate appropriate voltage signals that should be generated by DC to AC converter 82 to compensate for differences between actual current and reference current. A d-q to α-β domain transformation module 116 then generates a first or harmonic portion $v_{aref}$ of a reference voltage $v_{ref}$ for drawing the reference current or the harmonic current $i_{ref}$ from the power line. The d-q to α-β domain transformation module includes an inverse transformation matrix that may be equal to inverse of transformation matrix in equation 1.

A second or fundamental portion $v_{bref}$ of the reference voltage $v_{ref}$ is generated by a DC link voltage loop 118 which controls active power flow between the DC to AC converter 82 and the power line. The voltage loop 118 converts an error $V_{dcerror}$ between a reference DC link voltage $V_{dcref}$ and the actual DC link voltage $V_{dc}$ into a phase angle δ through a third PI controller 120. The phase angle δ represents a delay angle by which a sine wave generated by a sine wave module 124 should lag with respect to the line voltage $v_c$ so that a desired amount of active power will be drawn to maintain the DC link voltage $V_{dc}$ equal to the reference DC link voltage $V_{dcref}$. A theta generation module 122 determines a phase θ of the line voltage $v_c$ and the sine module 124 utilizes the phase angles δ and θ to generate an appropriate sine waveform representing the second portion $v_{bref}$ of the reference voltage $v_{ref}$. The addition of the $V_{aref}$ and the $v_{bref}$ then generates the reference voltage $v_{ref}$ for the DC to AC converter 82.

Figure 6:
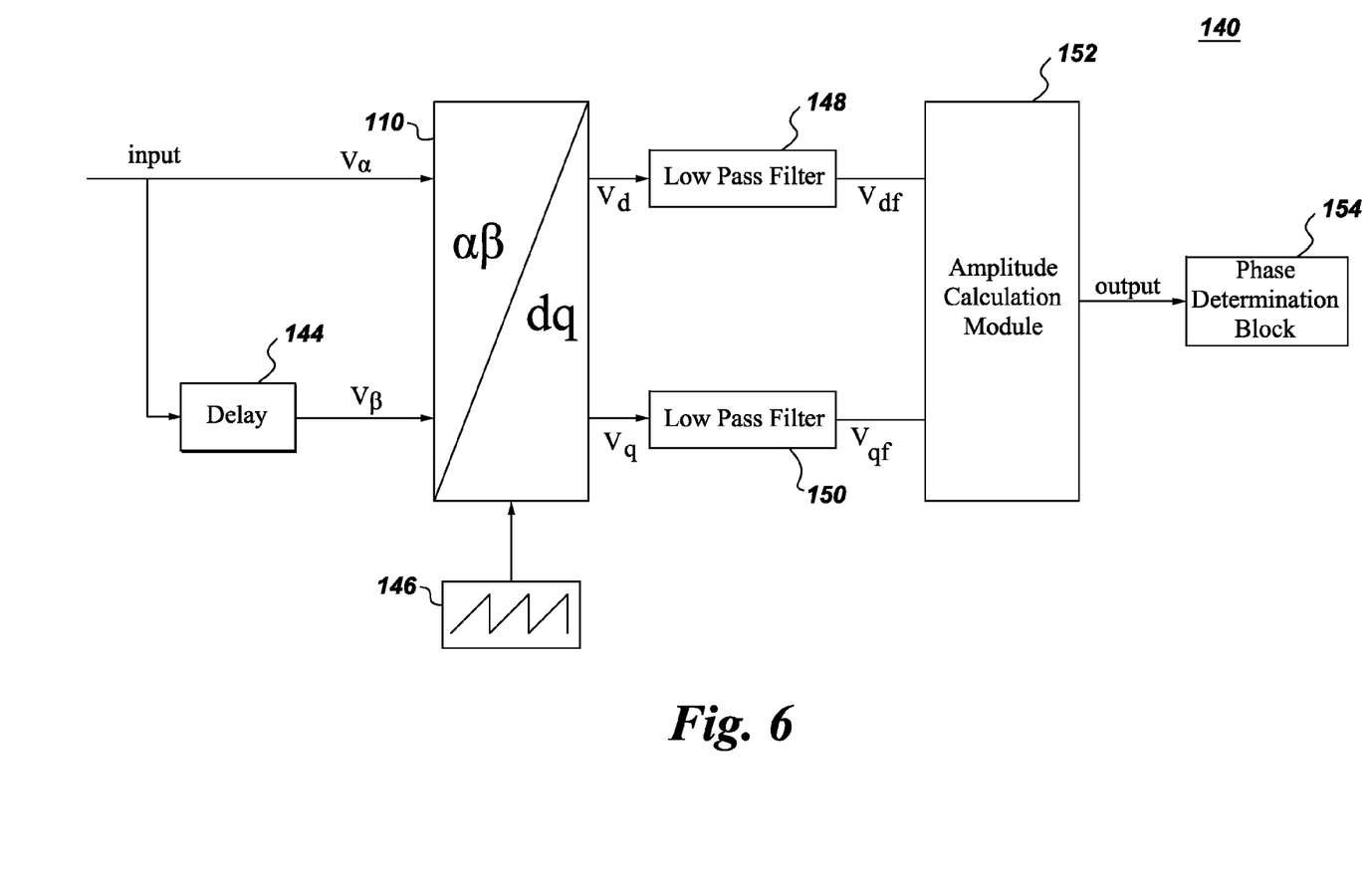
FIG. 6 is a block diagram of a phase detection device

FIG. 6 is a block diagram of a phase detection device 140 which determines a phase of the power line at the user end based on the distorted voltage in accordance with an embodiment of the present invention. For example, when three different currents of three different harmonic frequencies are drawn from three power lines it results into voltage distortions. The phase detection device 140 in each of the power line will then compute amplitude of a particular harmonic voltage in the power line and determine the phase (i.e., phase A, phase B, or phase C) of the received voltage or the power line if the computed amplitude is greater than a respective threshold value. The phase detection device 140 is utilized in meter 22 of FIG. 3 and can determine the phase of the power line irrespective of the method of voltage distortion. Thus, the method of voltage distortion may include injecting series harmonic voltages into the power line or drawing harmonic currents from a power line as described earlier.

The phase detection device 140 includes a domain transformation module 142 which converts an input signal $V_\alpha$ and a delayed input signal $V_\beta$ into d-q domain signals $V_d$ and $V_q$. The delayed input signal $V_\beta$ is generated by a delay module 144. In one embodiment, the delay module delays the input signal $V_\alpha$ by a delay angle equal to a ¼$^{th}$ or 90 degrees of a harmonic frequency i.e., 0.00666 seconds for a frequency of 600 Hz. It should be noted that the delay angle value 90 degrees is merely for representative purpose and in a discrete embodiment the delay angle value may depend on a sampling frequency of the phase detection device 140 and may be different than 90 degrees. The domain transformation matrix utilizes a saw tooth wave signal representing the harmonic frequency from a harmonic angle generation module 146 to generate d-q domain signals $V_d$ and $V_q$. The harmonic frequency is equal to the frequency of one of the three harmonic currents drawn from three power lines. Thus, the frequency of the saw tooth wave signal may be changed 2-3 times to detect which phase, the power line belongs to. For example, the harmonic frequencies of injected voltages in each of the phases are known and are stored in the phase detection device. When in one of the power lines the amplitude of the particular harmonic voltage signal exceeds a threshold value then it indicates presence of that harmonic distortion and then based on the harmonic frequency information stored in the phase detection device, the phase of the power line can be easily identified.

The d-q domain voltage signals $V_d$ and $V_q$ from domain transformation matrix 142 are then passed through low pass filters 148, 150 to eliminate any fundamental or higher harmonic signals and to generate d-q domain harmonic signals $V_{df}$ and $V_{qf}$. As will be appreciated by those skilled in the art the low pass filters 148, 150 may be implemented in an analog domain or a digital domain. In one embodiment, a transfer function G(s) of the low pass filter may be given as:

$$G(s) = \frac{K}{1 + a_1(s/\omega_c) + a_2(s/\omega_c)^2} \quad (1)$$

where K, a1 and a2 are constants and $\omega_c$ is the cut off frequency of the low pass filter. In one embodiment, the cut off frequency $\omega_c$ of the low pass filter is lower than the fundamental frequency and may be determined such that the output signal is substantially a constant value. The amplitude of the harmonic voltage signal is then determined by an amplitude calculation module 152 which identifies square root of summation of square values of d-q domain harmonic signals α and β. In one embodiment, to reduce computation complexity of the amplitude calculation module 152, absolute values of d-q domain harmonic signals α and β are first identified and then the absolute values are added to obtain the amplitude of the harmonic signal.

In one embodiment, phase determination module 154 compares the amplitude of the harmonic signal with a threshold value. If the amplitude exceeds the threshold value then the phase determination module 154 identifies that a harmonic current has been drawn from that phase. For each of the power lines, harmonic currents of different frequencies are drawn from the lines. In one embodiment, the frequencies for each of the phases are fixed and are also stored in the phase determination module 154. So when phase determination module 154 of that phase detects presence of the respective harmonic signal it identifies the phase of that power line. Other ways of determining phase may include comparing the time for which the amplitude of the harmonic signal exceeds the threshold value or comparing the number of instances for which the amplitude of the harmonic signal exceeds the threshold value.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A phase identification system, comprising:
   a power distribution station including a phase distortion device to generate voltage distortions of a known harmonic frequency in at least one of three phase voltage signals of the power distribution station; and
   a phase detection device configured to receive at least one of distorted three phase voltage signals and to identify a phase of the received voltage signal, the phase detection device comprising:
   a delay circuit for generating a phase shifted voltage signal of the received voltage signal;
   a transformation module for transforming the received voltage signal and the phase shifted voltage signal into d-q domain voltage signals of a known harmonic frequency reference frame;

an amplitude calculation module for calculating an amplitude of a harmonic of the known harmonic frequency in the received voltage based on the d-q domain voltage signals; and a phase determination module for determining the phase of the received voltage signal by comparing the amplitude of the harmonic of the known harmonic frequency in the received voltage signal with a threshold value.

2. The phase identification system of claim 1, wherein the known harmonic frequency is different for different phase voltage signals.

3. The phase identification system of claim 2, wherein the threshold value is different for different harmonic frequencies.

4. The phase identification system of claim 1, wherein the phase distortion devices comprises a voltage distortion circuit.

5. The phase identification system of claim 4, wherein the voltage distortion circuitry comprises a series voltage injection circuit for injecting harmonic voltages into a power of the power distribution station.

6. The phase identification system of claim 4, wherein the voltage distortion circuitry comprises a shunt current circuitry for drawing harmonic currents from a power line of the power distribution station.

7. The phase identification system of claim 6, wherein the shunt current circuitry comprises a single phase DC to AC converter for drawing a reference harmonic current from the power line of the power distribution station.

8. The phase identification system of claim 7, wherein the shunt current circuitry comprises a coupling transformer for providing isolation and matching a voltage of the power line of the power distribution station with an output voltage of the single phase DC to AC converter.

9. The phase identification system of claim 7, wherein the shunt current circuitry comprises a converter controller for generating a reference voltage signal for the single phase DC to AC converter, wherein the reference voltage signal is determined based on voltage distortions and a DC link voltage.

10. The phase identification system of claim 9, wherein the converter controller comprises a proportional integral controller for minimizing an error between the reference harmonic current and an actual drawn harmonic current by the single phase DC to AC converter.

11. The phase identification system of claim 9, wherein the converter controller comprises a proportional integral controller for minimizing an error between a reference DC link voltage and an actual DC link voltage of the single phase DC to AC converter.

12. The phase identification system of claim 1, wherein the phase shifted voltage signal is delayed by 90 degrees compared to the received voltage signal.

13. The phase identification system of claim 1, further comprising an amplitude calculation module to calculate the amplitude of the harmonic of the known harmonic frequency in the received voltage signal by obtaining a square root of square values of d-q domain voltage signals.

14. The phase identification system of claim 1, further comprising an amplitude calculation module to calculate the amplitude of the harmonic of the known harmonic frequency in the received voltage signal by adding absolute values of d-q domain voltage signals.

15. The phase identification system of claim 1, further comprising low pass filters to block high frequency content of d-q domain voltage signals and provide filtered d-q domain voltage signals.

16. The phase identification system of claim 1, wherein the distortions are generated upon command, on a schedule, or both upon command and on a schedule.

17. A method of identifying phase comprising:

distorting at least one of three phase voltage signals of a power distribution system with a known harmonic frequency signal;

receiving at least one of distorted three phase voltage signals from a power distribution system;

generating a phase shifted voltage signal of the received voltage signal by time delaying the received voltage signal;

transforming the received voltage signal and the phase shifted voltage signal into d-q domain voltage signals of a known harmonic frequency reference frame;

determining an amplitude of a harmonic of the known harmonic frequency in the received voltage based on the d-q domain voltage signals; and determining the phase of the received voltage signal by comparing the amplitude of the harmonic of the known harmonic frequency in the received voltage signal with a threshold value.

18. The method of claim 17, wherein determining the phase of the received voltage signals comprises computing the amplitude of a harmonic of the known harmonic frequency in the received voltage signal by obtaining a square root of square values of d-q domain voltage signals.

19. The method of claim 17, wherein distorting each of a three phase voltages comprises computing the amplitude of a harmonic of the known harmonic frequency in the received voltage signal by adding absolute values of d-q domain voltage signals.

20. The method of claim 17, wherein distorting each of a three phase voltages of a power distribution system comprises injecting series harmonic voltages into a power line of the power distribution system or drawing harmonic currents from a power line of the power distribution system.

21. The method of claim 17, wherein the known harmonic frequency is different for different phase voltage signals.

22. The phase identification system of claim 21, wherein the threshold value is different for different harmonic frequencies.

* * * * *